US012563859B2

(12) United States Patent
Klopfenstein et al.

(10) Patent No.: US 12,563,859 B2
(45) Date of Patent: Feb. 24, 2026

(54) PHOTOVOLTAIC CELL WITH A SPECIFIC ARRANGEMENT OF ENERGY COLLECTORS, AND METHOD FOR PRODUCING SUCH A CELL

(71) Applicant: ETA SA MANUFACTURE HORLOGERE SUISSE, Grenchen (CH)

(72) Inventors: François Klopfenstein, Delémont (CH); François Gueissaz, Cormondrèche (CH); Alexandre Didier, Erlach (CH)

(73) Assignee: ETA SA MANUFACTURE HORLOGERE SUISSE, Grenchen (CH)

( * ) Notice: Subject to any disclaimer, the term of this patent is extended or adjusted under 35 U.S.C. 154(b) by 0 days.

(21) Appl. No.: 18/782,244

(22) Filed: Jul. 24, 2024

(65) Prior Publication Data

US 2025/0081663 A1      Mar. 6, 2025

(30) Foreign Application Priority Data

Aug. 28, 2023      (EP) .................................... 23193763

(51) Int. Cl.
H10F 77/20 (2025.01)
H02S 10/40 (2014.01)
(Continued)

(52) U.S. Cl.
CPC ........... H10F 77/215 (2025.01); H10F 71/10 (2025.01); H10F 71/103 (2025.01); (Continued)

(58) Field of Classification Search
CPC .............................. H10F 77/215; H02S 10/40
See application file for complete search history.

(56) References Cited

U.S. PATENT DOCUMENTS 4,853,043 A * 8/1989 Umemoto ............... H10F 19/31
257/E27.125
5,324,364 A 6/1994 Matsuda et al.
(Continued)

FOREIGN PATENT DOCUMENTS

CH          718 934 A2     3/2023
CN      113917723 A     1/2022
(Continued)

OTHER PUBLICATIONS

European Search Report for EP 23 19 3763 dated Jan. 18, 2024.

*Primary Examiner* — Sadie White
(74) *Attorney, Agent, or Firm* — Sughrue Mion, PLLC

(57) ABSTRACT

A photovoltaic cell (1) including a first front collector layer (4), an amorphous silicon layer (6) on the first layer (4) and a second conductive layer (8) on the amorphous silicon layer (6). Electrical connection of the second conductive layer (8) to the first layer (4) is made through the amorphous silicon layer (6) at the periphery of the photovoltaic cell, the electrically conductive layer (8) comprising a positive peripheral bus (8'), which is connected to the TCO first layer (4) and to at least one positive connection terminal at one end of the positive peripheral bus, and a negative peripheral bus, which is connected to a negative connection terminal, and the positive and negative peripheral buses being asymmetrical relative to one another, with the positive peripheral bus being longer than the negative peripheral bus.

14 Claims, 5 Drawing Sheets

(51) Int. Cl.
   H10F 71/10          (2025.01)
   H10F 77/166          (2025.01)
(52) U.S. Cl.
   CPC ....... H10F 77/1662 (2025.01); H10F 77/244
                  (2025.01); *H02S 10/40* (2014.12)

(56)                        References Cited

U.S. PATENT DOCUMENTS

| | | | | |
|---|---|---|---|---|
| 6,791,905 B1 * | 9/2004 | Sekiguchi | .............. | G04C 10/02 |
| | | | | 368/80 |
| 2002/0029798 A1 * | 3/2002 | Miyoshi | ................ | H10F 71/103 |
| | | | | 136/244 |
| 2002/0050286 A1 | 5/2002 | Kubota | | |
| 2002/0157700 A1 * | 10/2002 | Ito | .......................... | H10F 19/37 |
| | | | | 257/E31.038 |

FOREIGN PATENT DOCUMENTS

| | | | |
|---|---|---|---|
| EP | 1045454 | A1 | 10/2000 |
| JP | 6-21494 | A | 1/1994 |
| WO | 98/04005 | A1 | 1/1998 |
| WO | 2023/030703 | A1 | 3/2023 |

* cited by examiner

PHOTOVOLTAIC CELL WITH A SPECIFIC ARRANGEMENT OF ENERGY COLLECTORS, AND METHOD FOR PRODUCING SUCH A CELL

CROSS REFERENCE TO RELATED APPLICATION

This application claims priority to European Patent Application No. 23193763.2 filed Aug. 28, 2023, the entire contents of which are incorporated herein by reference.

TECHNICAL FIELD OF THE INVENTION

The invention relates to a photovoltaic cell with a specific arrangement of collectors for collecting energy in the form of an electric current, and to the method for producing such a photovoltaic cell.

The present invention thus consists of optimising the efficiency of a photovoltaic cell for use in a portable electronic object, such as a wristwatch.

TECHNOLOGICAL BACKGROUND

Each photovoltaic cell has a general shape adapted to the shape of the portable object receiving it. Typically, it can be a circular cylindrical cell arranged either on an inner surface of the glass of the portable object receiving it, or on a surface of the dial visible from the outside of the portable object.

Such a photovoltaic cell is produced by means of a set of layers, in particular a first front layer that is transparent to ambient light, referred to as the front collector, which can be produced by means of a layer of zinc oxide doped with aluminium (ZnO:Al or AZO). This first layer can be arranged on the inner surface of the glass of the portable object facing the dial and on which is typically deposited a p-i-n type sequence (p-doped, intrinsic i, n-doped) of amorphous silicon (a-Si) thin layers, referred to as an absorber, which converts the absorbed light radiation into positive electric charge carriers (holes) and negative electric charge carriers (electrons). The structure typically ends with a second conductive layer, for example aluminium or another combination of metals, referred to as the rear collector.

In this configuration, the positive charge carriers drift towards the front collector where they are neutralised by electrons from an external electrical circuit. The negative charge carriers drift towards the rear collector where they supply the external circuit with electrons and form the negative charge current between the rear collector and the front collector. According to convention, this concerns a (positive) electric current flowing between the positive pole and the negative pole, so the charge current is negative in the configuration just described.

Initially, for technology using only one metal level, one embodiment, shown in FIG. 1, has been proposed for the production of the photovoltaic cell, according to the prior art. In this embodiment, the current collectors or peripheral buses are proposed in a symmetrical design, i.e. with peripheral buses of more or less identical length, width and thickness, forming two half-rings or arcs of a circle around the circumference of the circular cell. Typically speaking, the buses must be as long as possible, so as to encourage the most homogeneous distribution possible of the electric current in the front collector of the photovoltaic cell, which reduces resistive losses.

In the case of a homogeneous photovoltaic cell, referred to as a single-segment cell, as shown in FIG. 1, it can be seen that the current lines follow an approximately straight and parallel path between the two peripheral buses. With the current transparent conductive layer technology used to form the front collector, it should be noted that layer resistance is at least one to two orders of magnitude greater than that of the thin layer deposited at the rear of the cell to form the rear collector.

This difference in layer resistance results in a considerably higher potential gradient in the front collector than in the rear collector when an electric current flows through them, as well as a power loss that increases as the value of the electric current increases.

SUMMARY OF THE INVENTION

The present invention thus proposes a photovoltaic cell with a specific arrangement of current collectors or peripheral buses which substantially reduces the voltage drop within the front collector, which drop is induced by the electric current generated by the absorption layer following the capture of light.

To this end, the present invention relates to a photovoltaic cell arranged to substantially reduce the voltage drop across the front collector, as defined in independent claim 1.

Particular embodiments of the photovoltaic cell are defined in dependent claims 2 to 8.

In order to provide electrical contacts on only one side of a photovoltaic cell, a portion of the rear collector is typically separated, by chemical etching or another method, so that it can be used as a positive terminal. This positive terminal is electrically connected to the front collector by means of a metal bus deposited in an opening previously made through the sequence of thin amorphous silicon layers (absorber). The front collector, which is transparent and conductive (TCO) and can be made using a layer of zinc oxide doped with aluminium (ZnO:Al or AZO), has a much lower conductivity than the rear collector, which can be a metal layer made of aluminium, for example. This difference in conductivity is around 30 times worse.

Under these conditions, according to the present invention, at least one metal peripheral bus connected to the front collector is provided, which bus is much longer than the length of the metal peripheral bus provided in the rear collector. Preferably, the length of the front peripheral bus should be at least 10 times greater than the length of the rear peripheral bus. This asymmetry in length between the peripheral buses, which for example have the same width and the same thickness, makes it possible to limit or reduce the potential drop within the front collector to less than 100 mV. This represents a gain of almost 50 mV compared with the potential drop observed in a photovoltaic cell with symmetrical peripheral buses. The potential drop within the front collector can be less than 100 mV, which makes it possible to limit power loss with a photovoltaic cell that develops a voltage of no more than 600 to 700 mV before processing in an electronic module of a portable object.

Advantageously, two buses of asymmetrical lengths can be provided from the connection of the front collector to a portion of the rear collector, which is preferably the aluminium metal layer on an opposite face, which buses connect on the one hand the front collector, and on the other that connecting the aluminium metal layer defining the negative terminal.

Moreover, two peripheral bus sections can also be provided from the point of connection of the aluminium layer to the front collector, which bus sections are connected to the positive terminal describing a defined angle on either side of the point of connection to the front collector. The angle described by the peripheral bus of the positive front collector is much greater than the angle of the negative terminal of the aluminium layer. 330° coverage can be expected for the peripheral bus connected to the front collector, whereas this angle can be less than 30° for the negative terminal portion of the aluminium layer.

Advantageously, each free end of the positive peripheral bus connected to the front collector comprises a connection end so as to further reduce the current flowing through this metal peripheral bus. Thus, the two positive terminals linked to this peripheral bus connected to the front collector are intended to be connected in parallel by a flexible connector, for example to an electronic data processing module. The value of the electrical current flowing to each end of the metal peripheral bus is thus half that of the total current flowing to the negative terminal. This also means that there are two positive end terminals and one negative end terminal to be connected to the electronic module located mainly under the dial of the portable object.

To this end, the present invention further relates to a method for producing a photovoltaic cell, as defined in independent claim 9.

BRIEF DESCRIPTION OF THE FIGURES

The purposes, advantages and features of a photovoltaic cell with a specific arrangement of energy collectors, as well as those of a method for producing such a photovoltaic cell, will become clearer in the following description, which is non-limiting, given with reference to the drawings in which.

DETAILED DESCRIPTION OF THE INVENTION

The following description mainly describes a single-segment photovoltaic cell having a specific arrangement of current collectors comprising asymmetrical peripheral buses or collectors so as to reduce the voltage drop between at least one positive terminal and one negative terminal of the photovoltaic cell.

The single-segment photovoltaic cell mainly comprises a first front layer transparent to ambient light, referred to as the front collector, which can be produced by means of a layer of zinc oxide doped with aluminium (ZnO:Al or AZO). This first layer can be arranged on the inner surface of the glass of the portable object facing a dial and on which is typically deposited a p-i-n type sequence (p-doped, intrinsic i, n-doped) of amorphous silicon (a-Si) thin layers, referred to as an absorber, which produces positive electric charge carriers (holes) and negative electric charge carriers (electrons) under illumination. The structure typically ends with a second conductive layer, which can be a metal layer, for example made of aluminium or another combination of metals, referred to as the rear collector.

The single-segment photovoltaic cell can comprise a base layer on which it is formed. One of the faces of the glass of the portable object, or also part of the dial of the portable object, can serve as a base layer for the photovoltaic cell. In the remainder of the description, preference will be given to producing the complete photovoltaic cell on an inner face of the glass.

Figure 1:
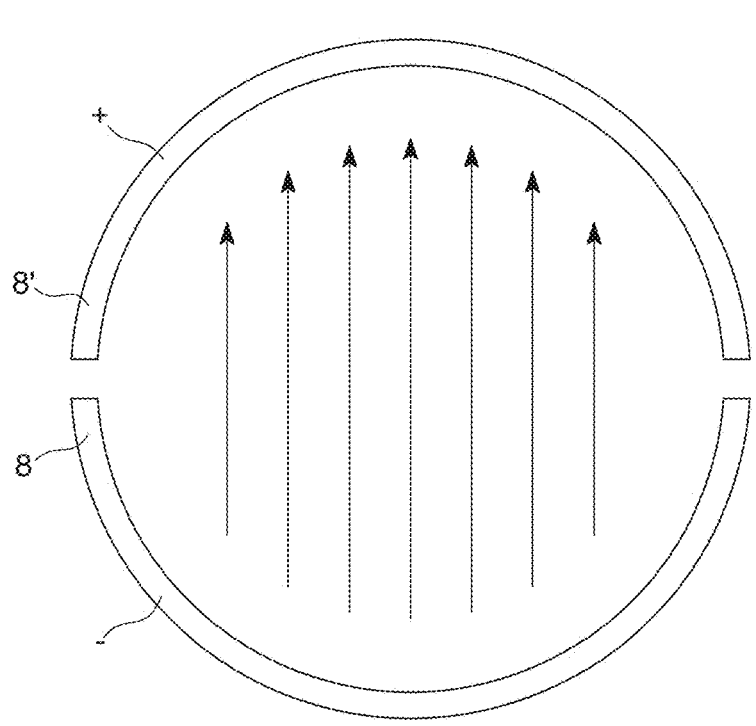
FIG. 1 shows a bottom view of the photovoltaic cell with symmetrical peripheral buses for the negative and positive terminals according to the prior art.
Figure 2:
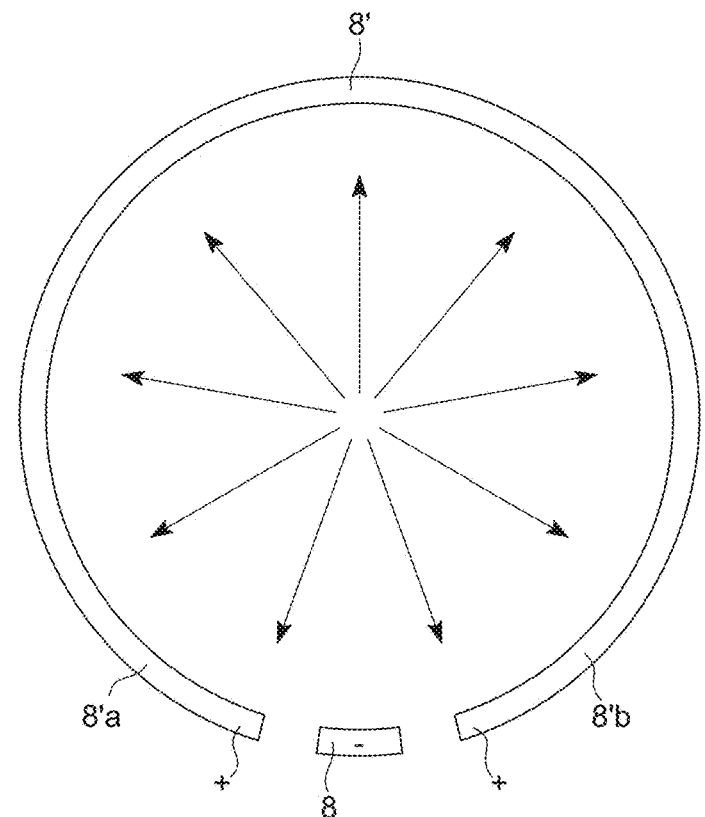
FIG. 2 shows a bottom view of the photovoltaic cell with asymmetrical peripheral buses of different lengths for connecting the front collector to the positive terminal and the rear collector to the negative terminal, which buses are made up of a metal layer already used to form the rear collector according to the present invention.

In comparison with FIG. 1 of the prior art, it can be noted that FIG. 2 shows a relatively summary embodiment with asymmetrical peripheral buses or collectors allowing the positive peripheral bus 8' connected to positive defined terminals 8'a and 8'b to fix a quasi-constant potential over the largest portion of the periphery of the front layer of the photovoltaic cell to which it is connected.

This modification, which aims to maintain a virtually constant potential over the greater part of the periphery of the front layer of the photovoltaic cell, makes it possible to force the quasi-radial configuration of the current lines, as shown in FIG. 2, and thereby reduce the potential difference between the highest value at the centre and the lowest at the periphery.

The rear collector connected to the defined negative terminal 8 consists of a metal layer of low electrical resistivity. This limits the potential difference between the terminal 8 and its diametral end to negligible values compared with the front collector, despite its unfavourable geometry.

The photovoltaic cell 1 is typically in the form of a circular cylinder. This portion of the cylinder can be intended to be fastened under the glass of the portable object or above the dial of the portable object. The portable object can be a watch, for example.

In this configuration shown in FIG. 2, the positive peripheral bus 8' connected to the front collector of the photovoltaic cell describes a portion of a circular arc with an angle of at least 330°. On the other hand, the arc of the negative peripheral bus 8 describes an angle of the order of 30° or less. A circular arc of almost 350° can even be envisaged for the positive peripheral bus and less than 10° for the negative peripheral bus 8.

The positive peripheral bus 8' is connected over a maximum portion of its length, and preferably over its entire length, to the front collector not shown in this FIG. 2. This means that this positive peripheral bus ends with a first positive terminal 8'a and opposite this with a second positive terminal 8'b, so as to be able to connect them, subsequently and via a specific connector, to the electronic module located under the dial of the portable object. The negative terminal of the negative peripheral bus will also be connected to the electronic module, subsequently and via the specific connector. These two positive terminals 8'a and 8'b of the positive peripheral bus 8' make it possible to reduce the voltage drop on the positive peripheral bus by three-quarters by placing parallel the two sectors of this bus, subsequently connected to the electronic module, by dividing by two, on the one hand the current collected, and on the other hand the distance to be covered.

FIGS. 3*a*, 3*b*, 3*c* and 3*d* show various steps of a method for producing a photovoltaic cell according to a first embodiment. As can be seen in the initial FIG. 3*a*, there is a base layer 2, which is a glass layer, and which forms part of the actual photovoltaic cell in this case. However, a plurality of layers, one on top of the other, can be used as the base layer 2, and these can consist of at least one glass layer on or under which one or more layers of a transparent material are placed, or also at the end of the method with the deposition of a sapphire layer on the one or more glass layers.

More typically, the photovoltaic cell 1 comprises, as a base layer, the first front collector layer 4, which is defined at the end of the production method as the front collector. A p-i-n type sequence (p-doped, intrinsic i, n-doped) of amorphous silicon (a-Si) thin layers, referred to as an absorber or defined as amorphous silicon layer 6, is deposited on the first front collector layer, and a second conductive layer 8, preferably a metal layer such as an aluminium layer, is added to this amorphous silicon layer 6.

All of the steps involved in producing and patterning the photovoltaic cell 1 are described below using a glass 2 of the portable object acting as a base layer and on which the three successive layers described above are produced and patterned, namely the first front collector layer 4, the amorphous silicon layer 6 and the second conductive layer 8.

This means that the photovoltaic cell 1 can comprise both the glass layer 2 and the three layers specified above, or just the three layers specified above.

It should also be noted that the photovoltaic cell 1 can also be mounted or fastened on a dial of the portable object. However, in this case, it is the front collector layer 8 which serves directly as the base layer, because at the end of the method for producing the single-segment photovoltaic cell 1, the latter is mounted or fastened on said dial of the portable object on the second conductive layer (rear collector) side, which can be a metal layer. This first layer of the front collector can advantageously be a layer of zinc oxide ZnO or a layer of zinc oxide doped with aluminium (ZnO:Al or AZO).

As the glass layer or layers of glass and sapphire are typically used as a glass of the portable object 2, the various subsequent steps are carried out on an inner face of the glass 2 of the portable object. The glass layer 2 is shown as a base layer on which the various other layers of the single-segment photovoltaic cell 1 are deposited.

Figure 3A:
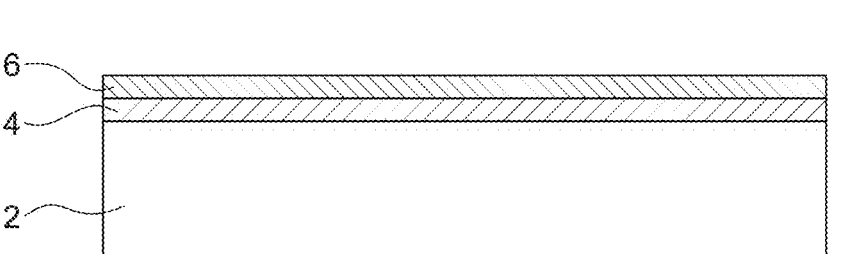
FIGS. 3a, 3b, 3c and 3d show cross-sections of the four steps of the method for producing the photovoltaic cell in a first embodiment, keeping the area of the electrically conductive layer without openwork parts in a central reading area of the photovoltaic cell, but clearly delimiting the positive areas from the negative areas.

FIG. 3*a* shows that, on one face of the glass layer 2, a first front collector layer 4 is firstly deposited, which is weakly electrically conductive. This can be a first front layer 4 which is a zinc oxide ZnO or a first zinc oxide layer doped with aluminium (ZnO:Al or AZO). Above this first front layer 4, a p-i-n type sequence (p-doped, intrinsic i, n-doped) of amorphous silicon (a-Si) thin layers is provided, referred to as a placed absorber or deposited amorphous silicon layer 6 which is used to capture electromagnetic waves, i.e. light for example, in order to convert it into electrical energy through the layers arranged above and below this amorphous silicon layer 6. The general shape of the front layer 4 and of the amorphous silicon layer 6 depends mainly on the general shape of the glass on which they are produced or deposited. Principally in this embodiment shown, the base layer, which is a glass 2 of the portable object, such as a watch, can be typically circular in shape when viewed from above or form a portion of a glass bell to close the watch case. Thus, the first front layer 4 takes the general shape of a circular cylinder so as to be deposited or fastened on an inner face of the watch glass 2. Similarly, the thin amorphous silicon layer 6 is arranged or deposited on the first front layer 4 and is similar in shape to this first front layer 4.

Figure 3B:
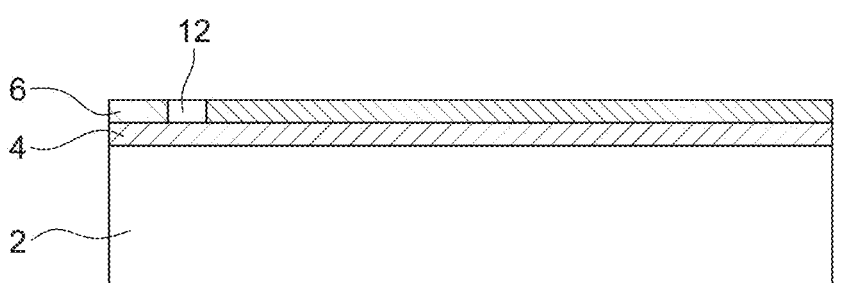
Figure 3C:
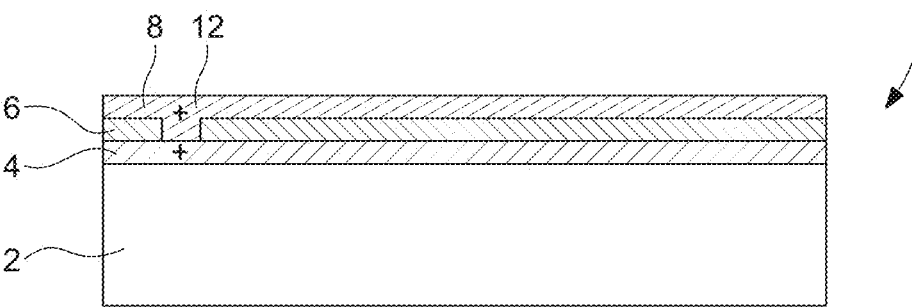

The second step of the method shown in FIG. 3*b* is to make an opening 12 typically in the peripheral position of the photovoltaic cell 1 through the p-i-n (p-doped, i-intrinsic, n-doped) sequence of amorphous silicon (a-Si) thin layers, defined as the amorphous silicon layer 6, showing access to the first front layer. Each opening 12 made to connect the first front collector layer can be made using a laser or other etching technique as used in microelectronics. Then, in the third step of the method for producing the photovoltaic cell 1 shown in FIG. 3*c*, a second conductive layer 8 is deposited on top of the amorphous silicon layer 6. This second conductive layer 8 is preferably a metal layer, such as a layer of aluminium. This metal layer, preferably made of aluminium, passes through the opening 12 made in the method step shown in FIG. 3*b*, to come into contact with the first front layer 4.

Figure 3D:
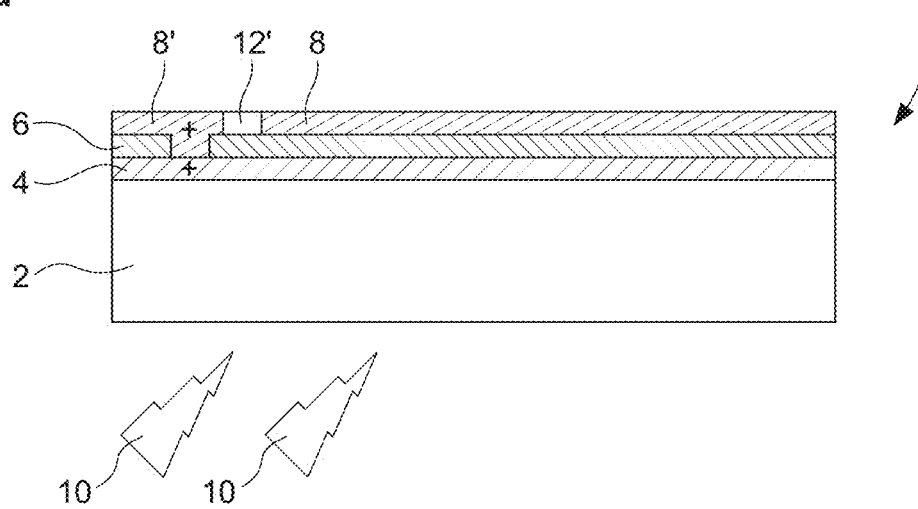

Finally, the last step of the manufacturing method shown in FIG. 3*d*, consists of separating the second conductive layer 8, which can be the metal layer for example made of aluminium 8, in order to contact the TCO front layer 4 on the one hand, and on the other hand the metal layer connected to the parts of at least one negative terminal of the photovoltaic cell. For this purpose, an opening 12' is made in the electrically conductive layer and through the electrically conductive layer 8, which can be an aluminium layer 8 and formed in such a way as to separate the aluminium metal layer 8', for example connected to the first front layer 4, from the aluminium metal layer 8 connected to the negative terminal of the photovoltaic cell 1.

At the end of the method of this first alternative embodiment of the photovoltaic cell 1 in FIG. 3*d*, light beams or light 10 can be captured by the photovoltaic cell 1. It will be explained below that the photovoltaic cell 1 is intended to be connected to an electronic module typically located beneath the dial of the portable object in order to convert light into electrical energy.

Figure 4:
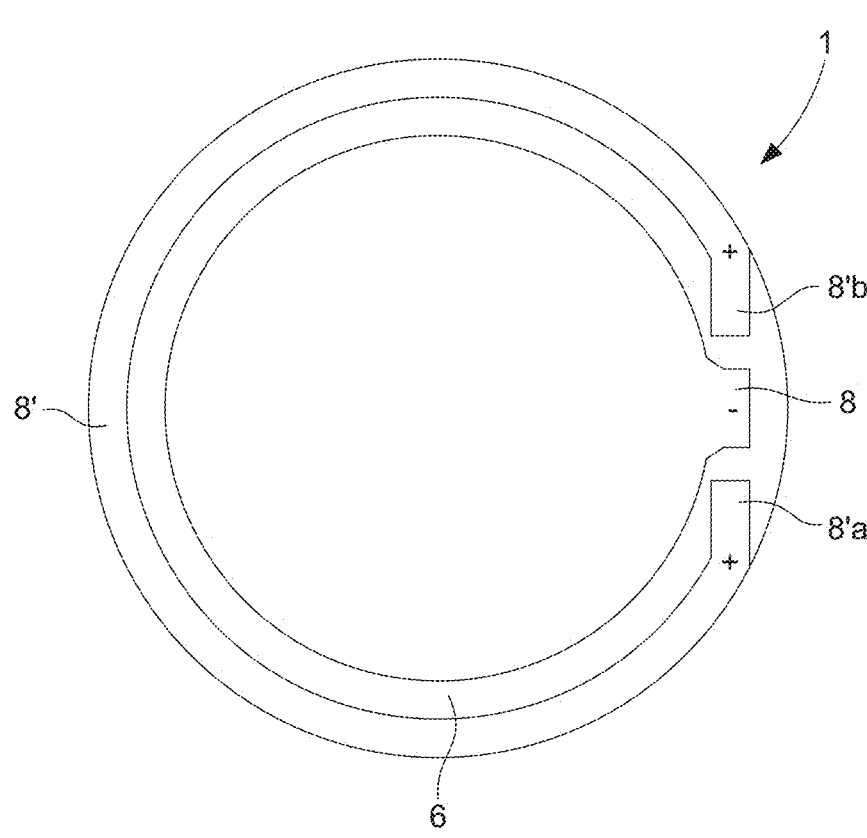
FIG. 4 shows a bottom view of the photovoltaic cell with asymmetrical peripheral buses, i.e. of different lengths in relation to the peripheral bus of the negative area, according to a first alternative embodiment of the present invention shown in a cross-section in FIG. 3d, FIGS. 5a, 5b, 5c and 5d show cross-sections of the four steps of the method for producing the photovoltaic cell according to a second alternative embodiment of the photovoltaic cell.

FIG. 4 shows a view from below at the end of the manufacturing method to show the separation of the second metal layer, for example made of aluminium, to connect the front collector layer on the one hand and the negative terminal of the photovoltaic cell 1 on the other. FIG. 4 clearly shows the asymmetrical peripheral buses of the present invention, i.e. the positive peripheral bus connected to the front collector layer, and the negative peripheral bus connected to the negative connection terminal of the photovoltaic cell.

The one or more openings made in the second conductive layer 8, such as the aluminium layer, allow the positive peripheral buses 8' to be produced for subsequent connection to an electronic module beneath the dial of the portable object. By making these openings, the amorphous silicon layer 6 below this conductive layer, which is an aluminium layer 8, can be seen.

Each positive peripheral bus from the connection with the first front collector layer terminates on a first side with a first positive terminal 8'*a* and on a second side with a second positive terminal 8'*b*. The two peripheral bus sectors together describe a total circular arc which is defined over at least 330°. The negative peripheral bus of the aluminium layer is represented only by the negative terminal 8, which faces the two positive terminals 8'a and 8'b. The negative peripheral bus has a circular arc of less than 30°, which shows the asymmetry of the positive and negative peripheral buses sought by the present invention.

Together, the two positive peripheral bus sectors 8' are approximately 10 times longer than the negative peripheral bus 8, which provides the advantage of reducing the voltage drop as mentioned above, particularly at higher illuminations, which produce a stronger electrical current.

Furthermore, in this first alternative embodiment, the negative terminal 8 is connected directly to the rest of the metal layer 8, which has no openwork parts and is surrounded by the two positive peripheral bus sectors 8'.

FIGS. 5a, 5b, 5c and 5d show cross-sections of the four steps in the method for producing the photovoltaic cell according to a second alternative embodiment of producing the photovoltaic cell. FIGS. 6a, 6b, 6c and 6d show cross-sections of the four steps in the method for producing the photovoltaic cell according to a third alternative embodiment of the photovoltaic cell.

It should be noted that all of the steps in the method for producing these second and third alternative embodiments of the method will not be repeated, as they are substantially similar to those described with reference to FIGS. 3a, 3b, 3c and 3d.

Figure 5A:
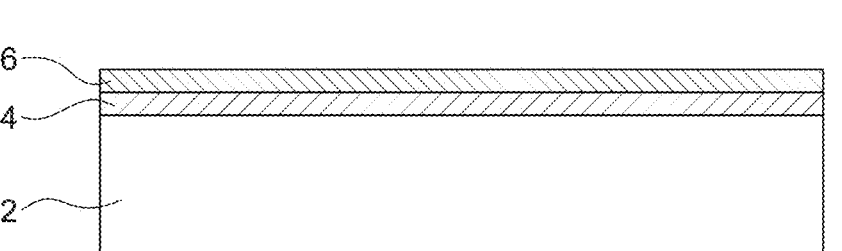
Figure 5B:
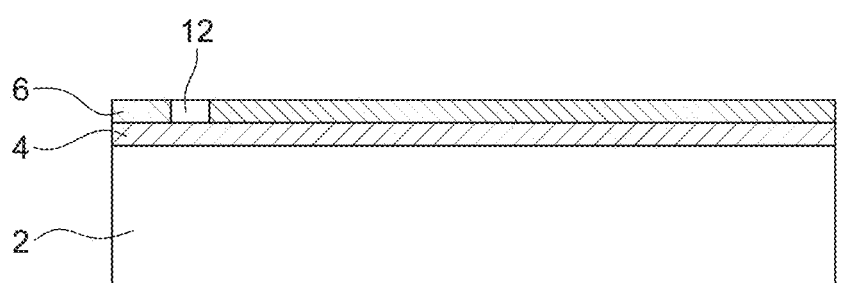
Figure 5C:
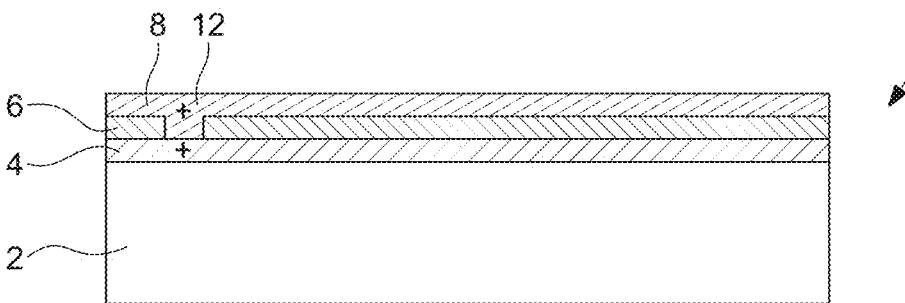
Figure 5D:
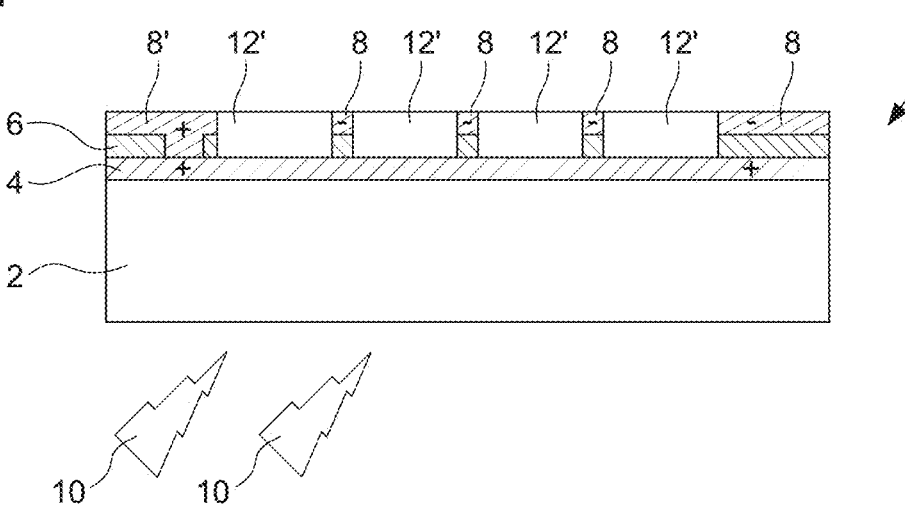

In the second alternative embodiment of the method for producing the photovoltaic cell 1, in the fourth step shown in FIG. 5d, chemical etching is carried out to etch both the conductive layer 8, such as a metal layer 8, and the amorphous silicon layer 6 to obtain the openings given the reference numeral 12' and defining openwork parts.

Figure 6A:
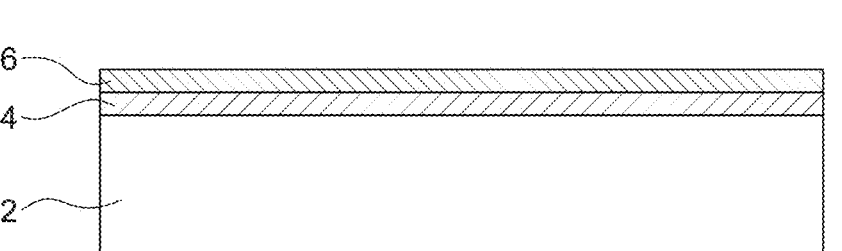
FIGS. 6a, 6b, 6c and 6d show cross-sections of the four steps of the method for producing the photovoltaic cell according to a third alternative embodiment of the photovoltaic cell.
Figure 6B:
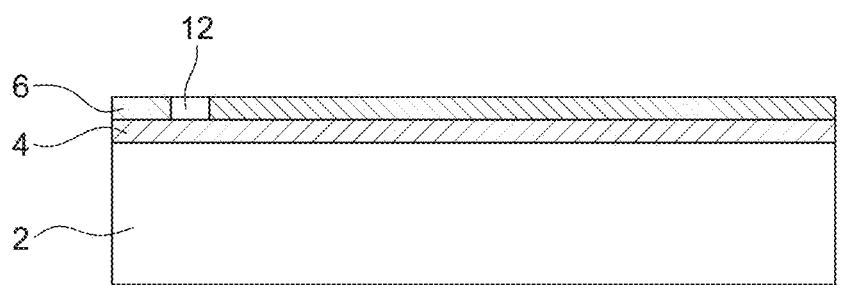
Figure 6C:
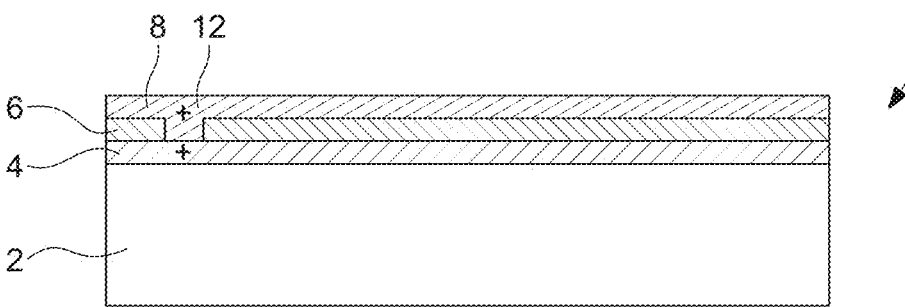
Figure 6D:
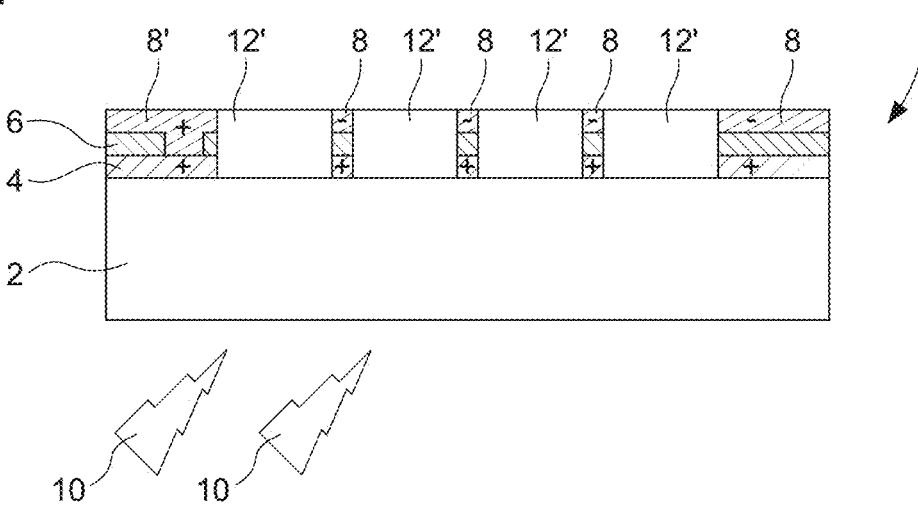

Similarly for the third alternative embodiment of the method for producing the photovoltaic cell 1, in the fourth step shown in FIG. 6d, chemical etching is carried out to etch both the conductive layer 8, such as a metal layer 8, and the amorphous silicon layer 6, as well as the first front layer 4 above the base layer, which can be the glass 2 of the portable object.

If openwork parts are used to make the photovoltaic cell semi-transparent, the cutaway can be chosen between 75 and 95%, i.e. at most 25% PV coverage, which becomes too visible, and at least 5%, which is difficult to design, as the cell power becomes too low.

However, as indicated at the beginning of the detailed description, the method for producing the photovoltaic cell can begin directly with a first front collector layer 4, which constitutes a base layer. From this base layer, the other layers are arranged in succession from one face of this first front collector layer 4. This first front collector layer 4 can advantageously consist of a layer of zinc oxide ZnO or a first layer of zinc oxide doped with aluminium (ZnO:Al or AZO).

In the case described above, the photovoltaic cell 1 produced is not combined with a glass of the portable object or directly on the dial of the portable object. With the photovoltaic cell 1 consisting solely of the three layers mentioned above, it must be possible to subsequently connect the connection terminals of the positive peripheral bus and of the negative peripheral bus to an electronic module located typically beneath the dial of the portable object so as to manage the signals received via its connection terminals with the positive and negative peripheral buses.

It should be noted that for the connection of these positive and negative peripheral bus connection terminals to the electronic module of the portable object, it can be possible to use a flexible connection of the FPC (flexible printed circuit) type bonded with an ACF (anisotropic conductive film), or a connector with spring rods, also referred to as a pogo, or even a Zebra type connector (resilient block containing regularly spaced conductive areas). However, the connection of the photovoltaic cell to the electronic module of the portable object will not be described in more detail, since the present invention is based mainly on the difference in length of the positive and negative peripheral buses, so as to optimise the efficiency of such a photovoltaic cell. In this case, thanks to the specific arrangement of the positive and negative peripheral buses, there is a reduction in the potential drop in connection with the low-conductivity TCO layer compared with photovoltaic cells in the prior art.

Various other forms of photovoltaic cell can be envisaged by a person skilled in the art without departing from the scope of the invention defined by the claims.

The invention claimed is:

1. A photovoltaic cell (1) configured to be arranged on an inner surface of a transparent glass or on a dial of a portable object, said photovoltaic cell (1) comprising a first transparent conductive layer (TCO) constituting a front collector layer (4), an amorphous silicon layer (6) on the front collector layer (4) and a conductive layer (8) on the amorphous silicon layer (6), constituting a rear collector, an electrical connection from the conductive layer (8) to the front collector layer (4) being made through the amorphous silicon layer (6),
    wherein the electrical connection of the conductive layer (8) to the front collector layer (4) is made through the amorphous silicon layer (6) at the periphery of the photovoltaic cell, wherein the conductive layer (8) comprises a positive peripheral bus (8'), which is connected to the front collector layer (4) and to at least two positive connection terminals (8'a, 8'b) at ends of the positive peripheral bus, and a negative peripheral bus, which is connected to a negative connection terminal, and wherein the positive and negative peripheral buses have different lengths along the periphery of the photovoltaic cell, with the positive peripheral bus having a greater length than the negative peripheral bus, and
    wherein the at least two positive connection terminals (8'a, 8'b) pass through the amorphous silicon layer (6) and contact the front collector layer (4), the at least two positive connection terminals (8'a, 8'b) being connected in parallel.

2. The photovoltaic cell (1) according to claim 1, wherein a thickness and width of the positive peripheral bus are substantially identical to a thickness and width of the negative peripheral bus, and wherein the length of the positive peripheral bus is at least more than 10 times greater than that of the negative peripheral bus.

3. The photovoltaic cell (1) according to claim 1, wherein the electrical connection of the electrically conductive layer (8) to the front collector layer (4) is made through the amorphous silicon layer (6) over the entire length of the positive peripheral bus of the conductive layer (8), and wherein the conductive layer (8) is a metal layer.

4. The photovoltaic cell (1) according to claim 3, wherein the metal layer is a layer of aluminium.

5. The photovoltaic cell (1) according to claim 3, wherein the photovoltaic cell is a circular cylinder in plan view, wherein the positive peripheral bus describes a total circular arc of 330° with a peripheral electrical connection to the front collector layer (4) over its entire length, wherein the positive peripheral bus terminates on a first side in a first positive connection terminal (8'a), and on a second opposite side in a second positive connection terminal (8'b), and wherein the negative peripheral bus comprising the negative connection terminal follows an arc of a circle of less than 30° on each side of the first positive connection terminal (8'*a*) of the positive peripheral bus and the second positive connection terminal (8'*b*) of the positive peripheral bus.

6. The photovoltaic cell (1) according to claim 3, wherein the photovoltaic cell is a circular cylinder in plan view, wherein the positive peripheral bus describes a total circular arc of 350° with a peripheral electrical connection to the front collector layer (4) over its entire length, wherein the positive peripheral bus terminates on a first side in a first positive connection terminal (8'*a*), and on a second opposite side in a second positive connection terminal (8'*b*), and wherein the negative peripheral bus comprising the negative connection terminal follows an arc of a circle of less than 10° on each side the first positive connection terminal (8'*a*) of the positive peripheral bus and the second positive connection terminal (8'*b*) of the positive peripheral bus.

7. The photovoltaic cell (1) according to claim 1, wherein the front collector layer (4), the amorphous silicon layer (6), and the conductive layer (8) are produced on an inner face of a glass of the portable object, so as to form a photovoltaic cell assembly with the glass of the portable object (2) forming part of the photovoltaic cell.

8. The photovoltaic cell (1) according to claim 1, wherein the conductive layer (8) is a metal layer which comprises, in a central portion connected to a negative terminal of the negative peripheral bus, openwork parts so as to render the photovoltaic cell semi-transparent.

9. A method for producing a photovoltaic cell (1) according to claim 1, wherein the method comprises steps of:

depositing an amorphous silicon layer (6) on a first transparent conductive layer (TCO) constituting a front collector layer (4), making an opening (12) through the amorphous silicon layer (6) to give access to the front collector layer (4), depositing an electrically conductive layer (8) on the amorphous silicon layer (6), with part of the electrically conductive layer (8) contacting front collector layer (4), making an opening through the amorphous silicon layer (6) located in a peripheral area of the photovoltaic cell (1), and separating the electrically conductive layer (8) in order to contact the front collector layer (4) and produce the positive peripheral bus (8'), and a metal layer connected to the parts of the negative peripheral bus connected to a negative terminal (8) of the photovoltaic cell, by producing, through the electrically conductive layer (8), an opening (12') in the electrically conductive layer.

10. The method according to claim 9, wherein the electrically conductive layer (8) is a metal layer that includes aluminium.

11. The method according to claim 9, wherein openwork parts are produced in a central part of the metal layer connected to the negative connection terminal.

12. The method according to claim 9, wherein all of the steps for producing the photovoltaic cell (1) are carried out on a base layer which is a glass (2) of a portable object forming part of the photovoltaic cell.

13. The photovoltaic cell (1) according to claim 1, wherein the electrical connection of the conductive layer (8) to the front collector layer (4) is made through the amorphous silicon layer (6) only at the periphery of the photovoltaic cell.

14. The photovoltaic cell (1) according to claim 13, wherein the conductive layer (8) is a metal layer that comprises aluminium.

* * * * *